United States Patent
Yamauchi

(10) Patent No.: US 8,969,736 B2
(45) Date of Patent: Mar. 3, 2015

(54) PRINTED CIRCUIT BOARD AND METHOD OF MANUFACTURING THE SAME

(71) Applicant: Daisuke Yamauchi, Ibaraki (JP)

(72) Inventor: Daisuke Yamauchi, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 300 days.

(21) Appl. No.: 13/671,029

(22) Filed: Nov. 7, 2012

(65) Prior Publication Data

US 2013/0126223 A1    May 23, 2013

Related U.S. Application Data

(60) Provisional application No. 61/567,241, filed on Dec. 6, 2011.

(30) Foreign Application Priority Data

Nov. 21, 2011   (JP) ................................ 2011-254039

(51) Int. Cl.
*H05K 1/11*    (2006.01)
*H05K 1/02*    (2006.01)
*G11B 5/48*    (2006.01)

(52) U.S. Cl.
CPC .............. *G11B 5/486* (2013.01); *H05K 1/0245* (2013.01); *H05K 1/0248* (2013.01)
USPC ........... 174/262; 174/251; 174/255; 174/258; 174/261; 174/264; 174/266; 361/784; 29/830; 29/841; 29/846; 439/620.24; 439/752; 360/75; 360/245.9

(58) Field of Classification Search
CPC ............. H01K 1/00; H01K 1/02; H01K 1/11; H01K 1/16; H01K 1/18; H01K 1/0245; H01K 3/10; G11B 5/48; G11B 5/486
USPC ......... 174/262, 251, 255, 258, 261, 264, 266; 361/784; 29/830, 841, 846; 439/620.24, 752; 360/75, 245.9
See application file for complete search history.

(56) References Cited

U.S. PATENT DOCUMENTS 5,717,547 A    2/1998  Young
5,737,152 A    4/1998  Balakrishnan (Continued)

FOREIGN PATENT DOCUMENTS

JP    10-124837 A    5/1998
JP    10-125023 A    5/1998

(Continued)

*Primary Examiner* — Xiaoliang Chen
(74) *Attorney, Agent, or Firm* — Panitch Schwarze Belisario & Nadel LLP

(57) ABSTRACT

A cover insulating layer is formed on a base insulating layer. One of write wiring traces includes first to third lines, and the other write wiring trace includes fourth to sixth lines. The one and other write wiring traces constitute a signal line pair, the second and fifth lines are arranged on an upper surface of the cover insulating layer, and the third and sixth lines are arranged on an upper surface of the base insulating layer. At least parts of the second and fifth lines are respectively opposed to the sixth and third lines with the cover insulating layer sandwiched therebetween. The second and third lines are electrically connected to the first line, and the fifth and sixth lines are electrically connected to the fourth line. The fourth line is electrically connected to at least one of the fifth and sixth lines through a jumper wiring on a lower surface of the base insulating layer.

6 Claims, 14 Drawing Sheets

(56) References Cited

U.S. PATENT DOCUMENTS

| | | |
|---|---|---|
| 5,760,995 A | 6/1998 | Heller et al. |
| 5,796,552 A | 8/1998 | Akin, Jr. et al. |
| 5,995,328 A | 11/1999 | Balakrishnan |
| 6,097,566 A | 8/2000 | Heller et al. |
| 2007/0218781 A1* | 9/2007 | Yokai et al. .................. 439/752 |
| 2009/0098745 A1 | 4/2009 | Kamei et al. |
| 2009/0151994 A1* | 6/2009 | Ohsawa et al. ............... 174/261 |
| 2009/0218126 A1* | 9/2009 | Honjo et al. .................. 174/264 |
| 2009/0250252 A1* | 10/2009 | Ho et al. ....................... 174/255 |
| 2010/0116537 A1* | 5/2010 | Ishii et al. ..................... 174/261 |
| 2010/0116540 A1 | 5/2010 | Ishii et al. |
| 2011/0102935 A1* | 5/2011 | Nagaoka et al. ................ 360/75 |
| 2011/0259632 A1* | 10/2011 | Oosawa et al. ............... 174/266 |

FOREIGN PATENT DOCUMENTS

| | | |
|---|---|---|
| JP | 2009-099687 A | 5/2009 |
| JP | 2010-135754 A | 6/2010 |

\* cited by examiner

F I G. 4
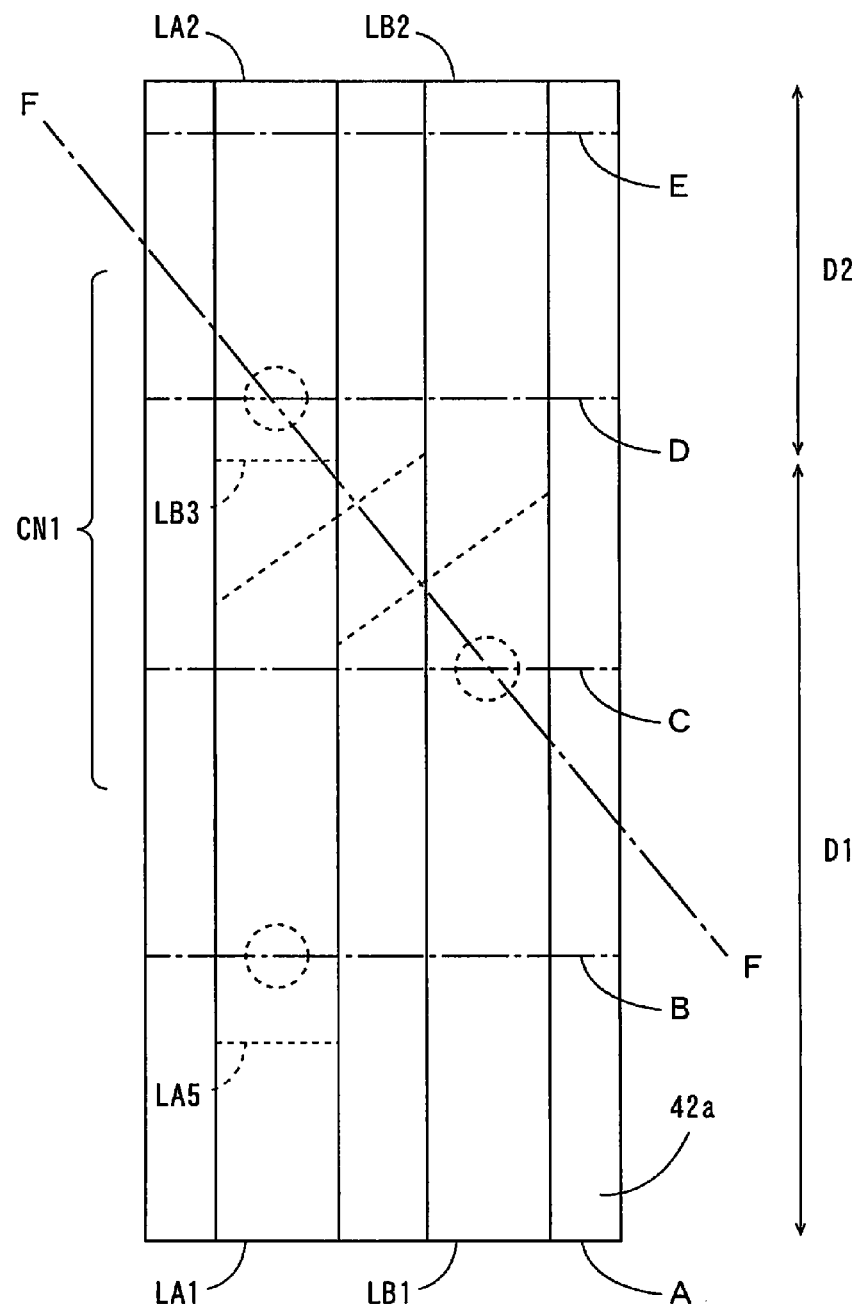

CROSS SECTION OF PORTION C

CROSS SECTION OF PORTION D

CROSS SECTION OF PORTION C

CROSS SECTION OF PORTION D

CROSS SECTION OF
PORTION C

CROSS SECTION OF
PORTION D

CROSS SECTION OF
PORTION C

CROSS SECTION OF
PORTION D

CROSS SECTION OF PORTION C

CROSS SECTION OF PORTION D

CROSS SECTION OF PORTION C

CROSS SECTION OF PORTION D

CROSS SECTION OF PORTION C

CROSS SECTION OF PORTION D

CROSS SECTION OF PORTION C

CROSS SECTION OF PORTION D

PRINTED CIRCUIT BOARD AND METHOD OF MANUFACTURING THE SAME

BACKGROUND OF THE INVENTION (1) Field of the Invention

The present invention relates to a printed circuit board and a method of manufacturing the same.

(2) Description of Related Art

Actuators are used in drives such as hard disk drives. Such an actuator includes an arm provided rotatably around a rotation shaft, and a suspension board with a circuit for a magnetic head that is attached to the arm. The suspension board with a circuit is a printed circuit board for positioning the magnetic head at a desired track of a magnetic disk.

The suspension board with a circuit includes a magnetic head, and is connected to another electronic circuit. A signal line is formed in the suspension board with a circuit, and an electrical signal is transmitted to the suspension board with a circuit through the signal line between the other electronic circuit and the magnetic head.

JP 10-124837 A discusses a trace interconnection array for electrically interconnecting a read/write converter head to a read/write circuit. In the trace interconnection array, a plurality of trace conductors are alternately arranged to be symmetric about a single surface.

JP 2009-99687 A discusses a suspension board with a circuit. In the suspension board with a circuit, a first read wiring, a second read writing, and a first write wiring, and a second write wiring are formed. The first read wiring and the first write wiring are formed on a base insulating layer while an intermediate insulating layer is formed on the base insulating layer to cover the first read wiring and the first write wiring. A second read wiring and a second write wiring are formed on the intermediate insulating layer to oppose the first read wiring and the first write wiring in a thickness direction.

JP 10-125023 A discusses an integrated load beam assembly for supporting a read/write head/slider assembly adjacent to a storage medium and electrically interconnecting a head to a read/write circuit configuration. A trace array in the load beam assembly includes first and second conductive traces. The first conductive trace branches into first and second trace paths. The second conductive trace branches into third and fourth trace paths. The first trace path of the first conductive trace and the third trace path of the second conductive trace are arranged on a first insulating polyimide layer. A second insulating polyimide layer is arranged on the first insulating polyimide layer. A second trace path of the first conductive trace and a fourth trace path of the second conductive trace are arranged on the second insulating polyimide layer.

BRIEF SUMMARY OF THE INVENTION

In the trace interconnection array discussed in JP 10-124837 A, an inductance between a plurality of trace conductors is reduced. Thus, the respective characteristic impedances of the plurality of trace conductors can be reduced. However, the plurality of trace conductors are alternately arranged so that the area of the trace interconnection array increases.

In the suspension board with a circuit discussed in JP 2009-99687 A, a second read wiring and a second write wiring are respectively arranged above a first read wiring and a first write wiring. Thus, the area of the suspension board with a circuit can be decreased. However, the respective characteristic impedances of the first read wiring and the second read wiring and the respective characteristic impedances of the first write wiring and the second write wiring are desirably reduced.

JP 10-125023 A does not discuss a configuration for each of the first and second conductive traces to branch into first to fourth trace paths. If the first or second trace path branching from the first conductive trace greatly bypasses the second conductive trace, for example, a great skew (shift in timing) may occur in a signal that is transmitted through the first and second trace paths. Similarly, if the third or fourth trace path branching from the second conductive trace greatly bypasses the first conductive trace, a great skew may occur in a signal that is transmitted through the third and fourth trace paths.

An object of the present invention is to provide a printed circuit board capable of reducing an impedance of a signal line pair and reducing a skew of a signal while inhibiting the occupied area of the signal line pair from increasing and a method of manufacturing the same.

(1) According to an aspect of the present invention, a printed circuit board includes a first insulating layer having first and second surfaces, a second insulating layer having third and fourth surfaces and formed on the first insulating layer so that the fourth surface contacts the first surface, first and second wiring traces formed on the first surface of the first insulating layer and the third surface of the second insulating layer, to constitute a signal line pair, and a conductive connection layer formed on the second surface of the first insulating layer, in which the first wiring trace includes a first line arranged on the first surface of the first insulating layer or the third surface of the second insulating layer, a second line arranged on the third surface of the second insulating layer and electrically connected to the first line, and a third line arranged on the first surface of the first insulating layer and electrically connected to the first line, the second wiring trace includes a fourth line arranged on the first surface of the first insulating layer or the third surface of the second insulating layer, a fifth line arranged on the third surface of the second insulating layer and electrically connected to the fourth line, and a sixth line arranged on the first surface of the first insulating layer and electrically connected to the fourth line, at least a part of the second line is opposed to the sixth line with the second insulating layer sandwiched therebetween, at least a part of the fifth line is opposed to the third line with the second insulating layer sandwiched therebetween, and the fourth line is electrically connected to at least one of the fifth and sixth lines through the connection layer.

In the printed circuit board, the second insulating layer is formed on the first insulating layer so that the fourth surface of the second insulating layer contacts the first surface of the first insulating layer. The first and second wiring traces constitute the signal line pair.

The first line in the first wiring trace is arranged on the first surface of the first insulating layer or the third surface of the second insulating layer. The second line is arranged on the third surface of the second insulating layer. The third line is arranged on the first surface of the first insulating layer. The second and third lines are electrically connected to the first line. Thus, the first line branches into the second line and the third line. The fourth line in the second wiring trace is arranged on the first surface of the first insulating layer or the third surface of the second insulating layer. The fifth line is arranged on the third surface of the second insulating layer. The sixth line is arranged on the first surface of the first insulating layer. The fifth and sixth lines are electrically connected to the fourth line. Thus, the fourth line branches into the fifth line and the sixth line.

At least a part of the second line in the first wiring trace is opposed to the sixth line in the second wiring trace with the second insulating layer sandwiched therebetween. At least a part of the fifth line in the second wiring trace is opposed to the third line in the first wiring trace with the second insulating layer sandwiched therebetween. Further, the second line in the first wiring trace and the fifth line in the second wiring trace are opposed to each other on the second insulating layer. The third line in the first wiring trace and the sixth line in the second wiring trace are opposed to each other on the first insulating layer.

Thus, the area in which the first wiring trace and the second wiring trace are opposed to each other increases so that the respective capacitances of the first and second wiring traces increase. As a result, the respective characteristic impedances of the first and second wiring traces are reduced.

The second line in the first wiring trace and the sixth line in the second wiring trace overlap each other with the second insulating layer sandwiched therebetween, the third line in the first wiring trace and the fifth line in the second wiring trace overlap each other with the second insulating layer sandwiched therebetween. Thus, the occupied area of the second and third lines in the first wiring trace and the fifth and sixth lines in the second wiring trace decreases.

The fourth line is electrically connected to at least one of the fifth and sixth lines through the connection layer on the second surface of the first insulating layer. In this case, a branch portion from the first line into the second and third lines in the first wiring trace and a branch portion from the fourth line into the fifth and sixth lines in the second wiring trace can be formed at different positions in a thickness direction of the first insulating layer. Thus, the occupied area of the branch portion of the first wiring trace and the branch portion of the second wiring trace can be prevented from increasing.

Further, one of the second and third lines need not greatly bypass the second wiring trace in the branch portion of the first wiring trace, and one of the fifth and sixth lines need not greatly bypass the first wiring trace in the branch portion of the second wiring trace. Therefore, the respective lengths of the second and third lines in the first wiring trace can be easily made equal to each other, and the respective lengths of the fifth and sixth lines in the second wiring trace can be easily made equal to each other. Thus, a skew (a shift in timing) of a signal that transmits the second and third lines in the first wiring trace and a skew of a signal that transmits the fifth and sixth lines in the second wiring trace can be reduced.

(2) The first insulating layer may have a first through hole between the fourth line and the connection layer, and have a second through hole between at least one of the fifth and sixth lines and the connection layer, the fourth line may be electrically connected to the connection layer through the first through hole, and at least one of the fifth and sixth lines may be electrically connected to the connection layer through the second through hole.

In this case, the fourth line is electrically connected to the connection layer through the first through hole in the first insulating layer. At least one of the fifth and sixth lines is electrically connected to the connection layer through the second through hole in the first insulating layer. Thus, the occupied area of the branch portion of the second wiring trace can be decreased. As a result, the printed circuit board can be miniaturized.

(3) The first line and the fourth line may be formed on the third surface of the second insulating layer.

In this case, the first line in the first wiring trace and the fourth line in the second wiring trace are arranged on the same third surface. Thus, the first and second wiring traces can be easily connected to another circuit or terminal provided on the same surface.

(4) The first line and the fourth line may be formed on the first surface of the first insulating layer.

In this case, the first line in the first wiring trace and the fourth line in the second wiring trace are arranged on the same first surface. Thus, the first and second wiring traces can be easily connected to another circuit or terminal provided on the same surface.

(5) One of the first line and the fourth line may be formed on the first surface of the first insulating layer, and the other one of the first line and the fourth line may be formed on the third surface of the second insulating layer.

In this case, one of the first and second wiring traces can be easily connected to another circuit or terminal formed on the first surface of the first insulating layer. The other of the first and second wiring traces can be easily connected to another circuit or terminal formed on the third surface of the second insulating layer.

(6) According to another aspect of the present invention, a method of manufacturing a printed circuit board includes the steps of forming on a first insulating layer having first and second surfaces a second insulating layer having third and fourth surfaces so that the fourth surface contacts the first surface, forming first and second wiring traces constituting a signal line pair on the first surface of the first insulating layer and the third surface of the second insulating layer, and forming a conductive connection layer on the second surface of the first insulating layer, in which the step of forming the first wiring trace includes the steps of forming a second line on the third surface of the second insulating layer, forming a third line on the first surface of the first insulating layer, and forming a first line on the first surface of the first insulating layer or the third surface of the second insulating layer, the second and third lines are electrically connected to the first line, the step of forming the second wiring trace includes the steps of forming a fifth line on the third surface of the second insulating layer, forming a sixth line on the first surface of the first insulating layer, and forming a fourth line on the first surface of the first insulating layer or the third surface of the second insulating layer, the fifth and sixth lines are electrically connected to the fourth line, at least a part of the second line is opposed to the sixth line with the second insulating layer sandwiched therebetween, at least a part of the fifth line is opposed to the third line with the second insulating layer sandwiched therebetween, and the fourth line is electrically connected to at least one of the fifth and sixth lines through the connection layer.

According to the method of manufacturing the printed circuit board, the second insulating layer is formed on the first insulating layer so that the fourth surface of the second insulating layer contacts the first surface of the first insulating layer. The first and second wiring traces constitute the signal line pair.

The first line in the first wiring trace is arranged on the first surface of the first insulating layer or the third surface of the second insulating layer. The second line is arranged on the third surface of the second insulating layer. The third line is arranged on the first surface of the first insulating layer. The second and third lines are electrically connected to the first line. Thus, the first line branches into the second line and the third line. The fourth line in the second wiring trace is arranged on the first surface of the first insulating layer and the third surface of the second insulating layer. The fifth line is arranged on the third surface of the second insulating layer. The sixth line is arranged on the first surface of the first insulating layer. The fifth and sixth lines are electrically connected to the fourth line. Thus, the fourth line branches into the fifth line and the sixth line.

At least a part of the second line in the first wiring trace is opposed to the sixth line in the second wiring trace with the second insulating layer sandwiched therebetween. At least a part of the fifth line in the second wiring trace is opposed to the third line in the first wiring trace with the second insulating layer sandwiched therebetween. Further, the second line in the first wiring trace and the fifth line in the second wiring trace are opposed to each other on the second insulating layer. The third line in the first wiring trace and the sixth line in the second wiring trace are opposed to each other on the first insulating layer.

Thus, the area in which the first wiring trace and the second wiring trace are opposed to each other increases so that the respective capacitances of the first and second wiring traces increase. As a result, the respective characteristic impedances of the first and second wiring traces are reduced.

The second line in the first wiring trace and the sixth line in the second wiring trace overlap each other with the second insulating layer sandwiched therebetween, the third line in the first wiring trace and the fifth line in the second wiring trace overlap each other with the second insulating layer sandwiched therebetween. Thus, the occupied area of the second and third lines in the first wiring trace and the fifth and sixth lines in the second wiring trace decreases.

The fourth line is electrically connected to at least one of the fifth and sixth lines through the connection layer on the second surface of the first insulating layer. In this case, a branch portion from the first line into the second and third lines in the first wiring trace and a branch portion from the fourth line into the fifth and sixth lines in the second wiring trace can be formed at different positions in a thickness direction of the first insulating layer. Thus, the occupied area of the branch portion of the first wiring trace and the branch portion of the second wiring trace can be prevented from increasing.

Further, one of the second and third lines need not greatly bypass the second wiring trace in the branch portion of the first wiring trace, and one of the fifth and sixth lines need not greatly bypass the first wiring trace in the branch portion of the second wiring trace. Therefore, the respective lengths of the second and third lines in the first wiring trace can be easily made equal to each other, and the respective lengths of the fifth and sixth lines in the second wiring trace can be easily made equal to each other. Thus, a skew (shift in timing) of a signal that transmits the second and third lines in the first wiring trace and a skew of a signal that transmits the fifth and sixth lines in the second wiring trace can be reduced.

According to the present invention, it is possible to reduce the impedance of the signal line pair and the skew of the signal while preventing the occupied area of the signal line pair from increasing.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 4 is an enlarged plan view of portions of write wiring traces on an upper surface of a cover insulating layer in the portion X of the suspension board illustrated in FIG. 2;

DESCRIPTION OF THE PREFERRED EMBODIMENTS

A printed circuit board according to an embodiment of the present invention and a method of manufacturing the same will be described below with reference to the drawings. A configuration of a suspension board used for an actuator in a hard disk drive as a printed circuit board according to the embodiment of the present invention, and a method of manufacturing the same will be described below.

(1) Configuration of Suspension Board

Figure 1:
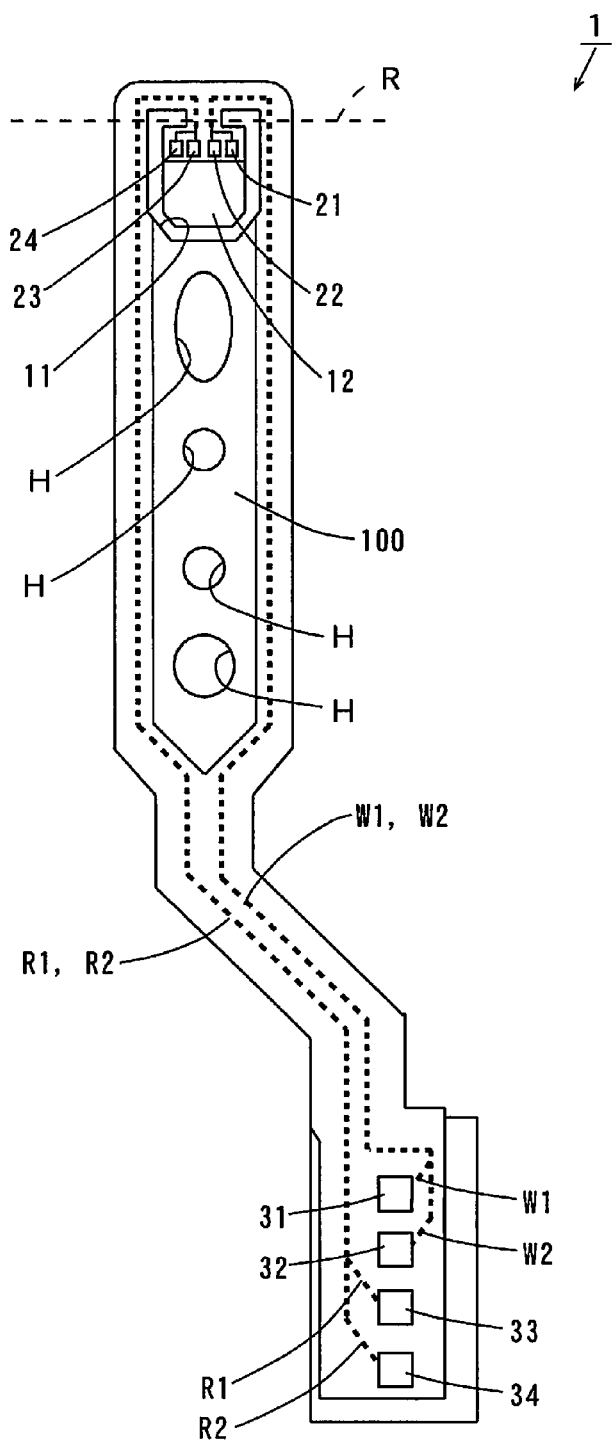
FIG. 1 is a top view of a suspension board according to an embodiment of present invention.

FIG. 1 is a top view of a suspension board according to an embodiment of the present invention. As illustrated in FIG. 1, a suspension board 1 includes a suspension main body 100 formed of a long-sized support substrate made of a metal. Write wiring traces W1 and W2 and read wiring traces R1 and R2 are formed, as indicated by thick dotted lines, respectively, on the suspension main body 100. The write wiring trace W1 and the write wiring trace W2 constitute a signal line pair. The read wiring trace R1 and the read wiring trace R2 constitute a signal line pair.

At a tip of the suspension main body 100, a magnetic head supporting portion (hereinafter referred to as a tongue) 12 is provided by forming a U-shaped opening 11. The tongue 12 is bent along a broken line R to form a predetermined angle with the suspension main body 100. The tongue 12 has four electrode pads 21, 22, 23, and 24 formed at its end.

Four electrode pads 31, 32, 33, and 34 are formed at the other end of the suspension main body 100. The write wiring traces W1 and W2 and the read wiring traces R1 and R2 electrically connect the electrode pads 21 to 24 on the tongue 12 and electrode pads 31 to 34 at the other end of the suspension main body 100 to each other, respectively. A plurality of holes H are formed in the suspension main body 100.

In a hard disk device (not illustrated) including the suspension board 1, a current flows through the pair of write wiring traces W1 and W2 when information is written into a magnetic disk. A current flows through the pair of read wiring traces R1 and R2 when information is read into the magnetic disk.

(2) Write Wiring Trace

Figure 2:
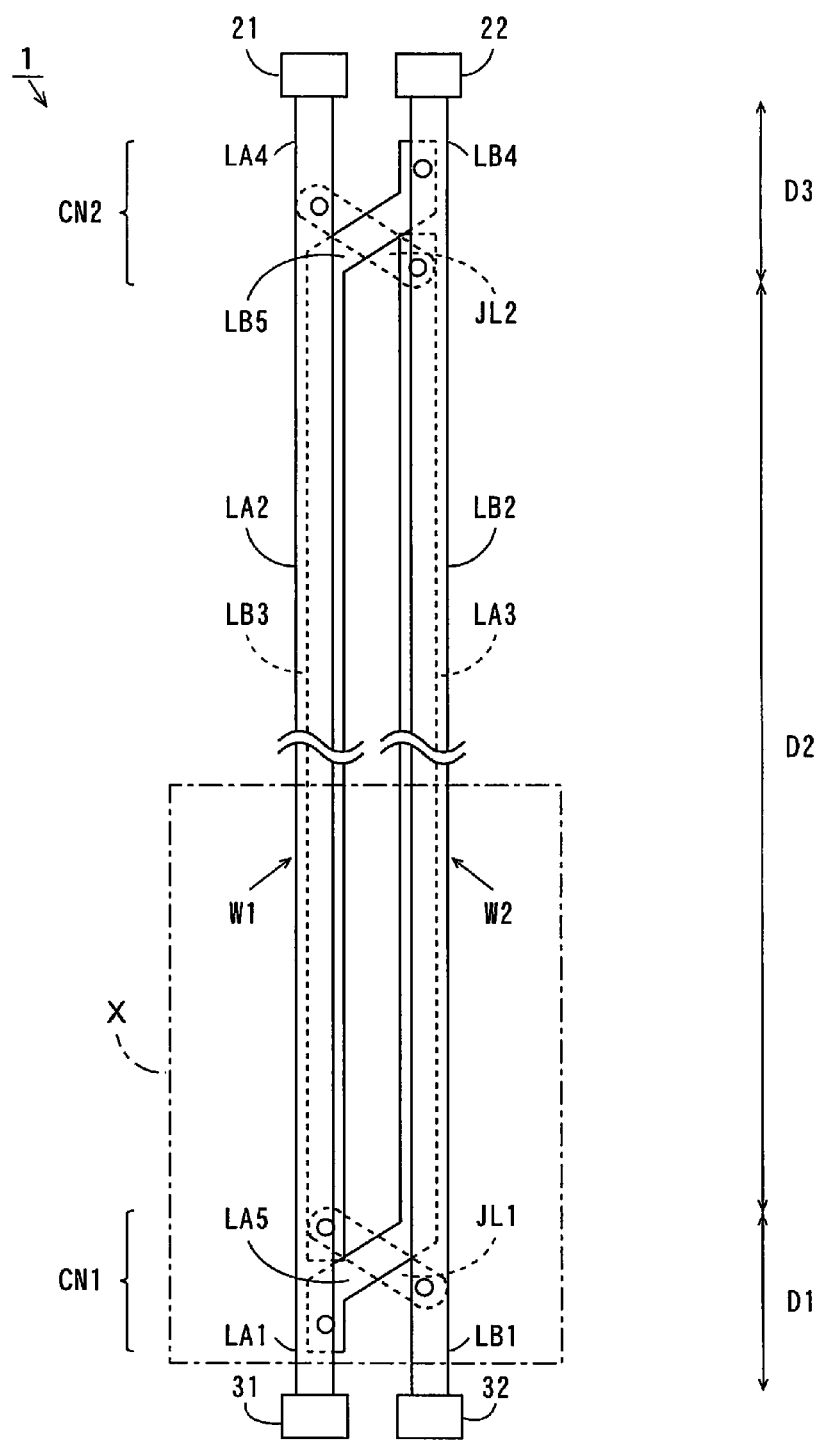
FIG. 2 is a plan view illustrating a configuration of write wiring traces.
Figure 3:
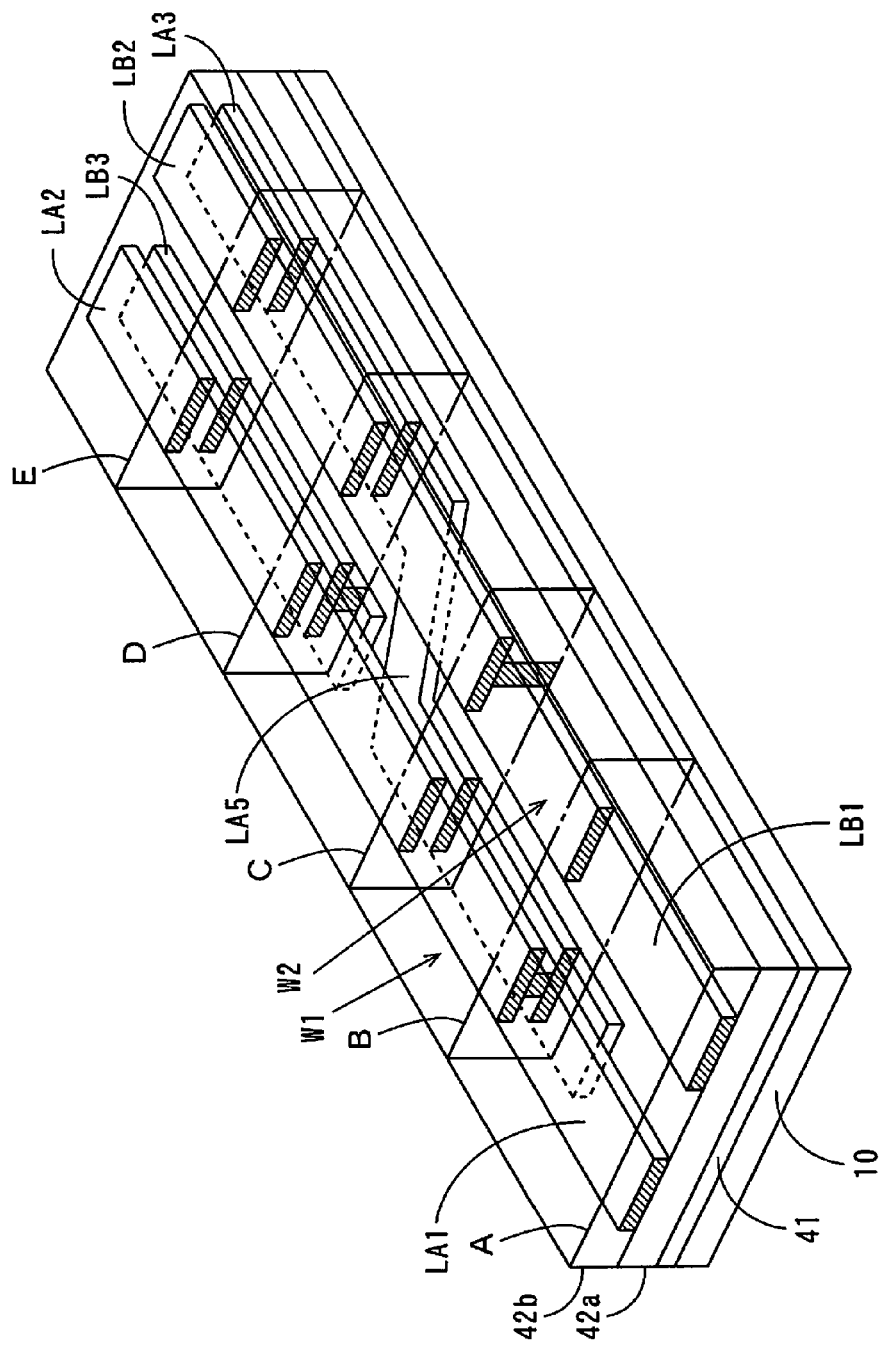
FIG. 3 is a perspective view of a portion X of the suspension board illustrated in FIG. 2.

A detailed configuration of the write wiring traces W1 and W2 will be described below. FIG. 2 is a plan view illustrating a configuration of the write wiring traces W1 and W2. FIG. 3 is a perspective view of a portion X of the suspension board 1 illustrated in FIG. 2.

As illustrated in FIG. 2, the write wiring trace W1 includes lines LA1 to LA5. The write wiring trace W2 includes lines LB1 to LB5. As illustrated in FIG. 3, a base insulating layer 41 is formed on a support substrate 10 made of a metal. The lines LA3 and LA5 in the write wiring trace W1 and the lines LB3 and LB5 in the write wiring trace W2 are formed on an upper surface of the base insulating layer 41. A cover insulating layer 42a is formed on the upper surface of the base insulating layer 41 to cover the lines LA3 and LA5 in the write wiring trace W1 and the lines LB3 and LB5 in the write wiring trace W2. Thus, a lower surface of the cover insulating layer 42a and the upper surface of the base insulating layer 41 contact each other.

The lines LA1, LA2, and LA4 in the write wiring trace W1 and the lines LB1, LB2, and LB4 in the write wiring trace W2 are formed on an upper surface of the cover insulating layer 42a. A cover insulating layer 42b is formed on the upper surface of the cover insulating layer 42a to cover the lines LA1, LA2, and LA4 in the write wiring trace W1 and the lines LB1, LB2, and LB4 in the write wiring trace W2. Thus, a lower surface of the cover insulating layer 42b and the upper surface of the cover insulating layer 42a contact each other.

Thus, the lines LA3 and LA5 and the lines LB3 and LB5 are formed on a plane at a first height. The lines LA1, LA2, and LA4 and the lines LB1, LB2, and LB4 are formed on a plane at a second height larger than the first height. The line LA3 is positioned below the line LB2, and the line LB3 is positioned below the line LA2.

As illustrated in FIG. 2, the line LA2 in the write wiring trace W1 and the line LB2 in the write wiring trace W2 are spaced apart from and parallel to each other. The line LA3 in the write wiring trace W1 and the line LB3 in the write wiring trace W2 are spaced apart from and parallel to each other.

One end of the line LA2 is integrated with one end of the line LA1, and the other end of the line LA2 is integrated with one end of the line LA4. The other end of the line LA1 is connected to the electrode pad 31, and the other end of the line LA4 is connected to the electrode pad 21. One end of the line LA5 is electrically connected to one end of the line LA1, and the other end of the line LA5 is integrated with one end of the line LA3. The other end of the line LA3 and the other end of the line LA2 are electrically connected to each other in an interconnection region CN2. Details of the interconnection region CN2 will be described below.

One end of the line LB2 is integrated with one end of the line LB1, and the other end of the line LB2 is integrated with one end of the line LB4. The other end of the line LB1 is connected to the electrode pad 32, and the other end of the line LB4 is connected to the electrode pad 22. One end of the line LB5 is electrically connected to one end of the line LB4, and the other end of the line LB5 is integrated with one end of the line LB3. The other end of the line LB3 and the one end of the line LB2 are electrically connected to each other in an interconnection region CN1. Details of the interconnection region CN1 will be described below.

A region at one end of the suspension board 1 where the lines LA1 and LB1 are arranged is referred to as a first region D1. A region at a substantially central portion of the suspension board 1 where the lines LA2, LA3, LB2, and LB3 are arranged is referred to as a second region D2. A region at the other end of the suspension board 1 where the lines LA4 and LB4 are arranged is referred to as a third region D3.

Figure 5:
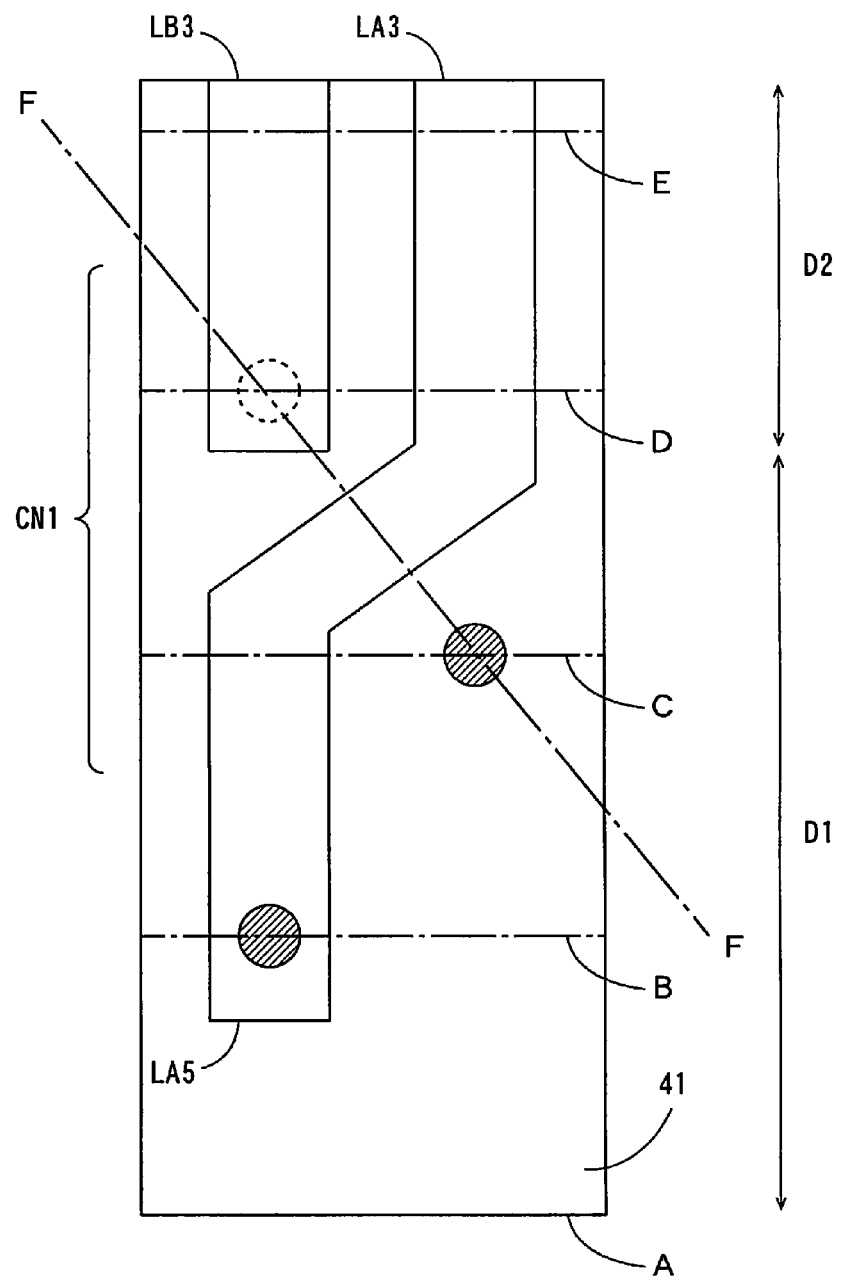
FIG. 5 is an enlarged plan view of portions of write wiring traces on an upper surface of a base insulating layer in the portion X of the suspension board illustrated in FIG. 2.
Figure 6:
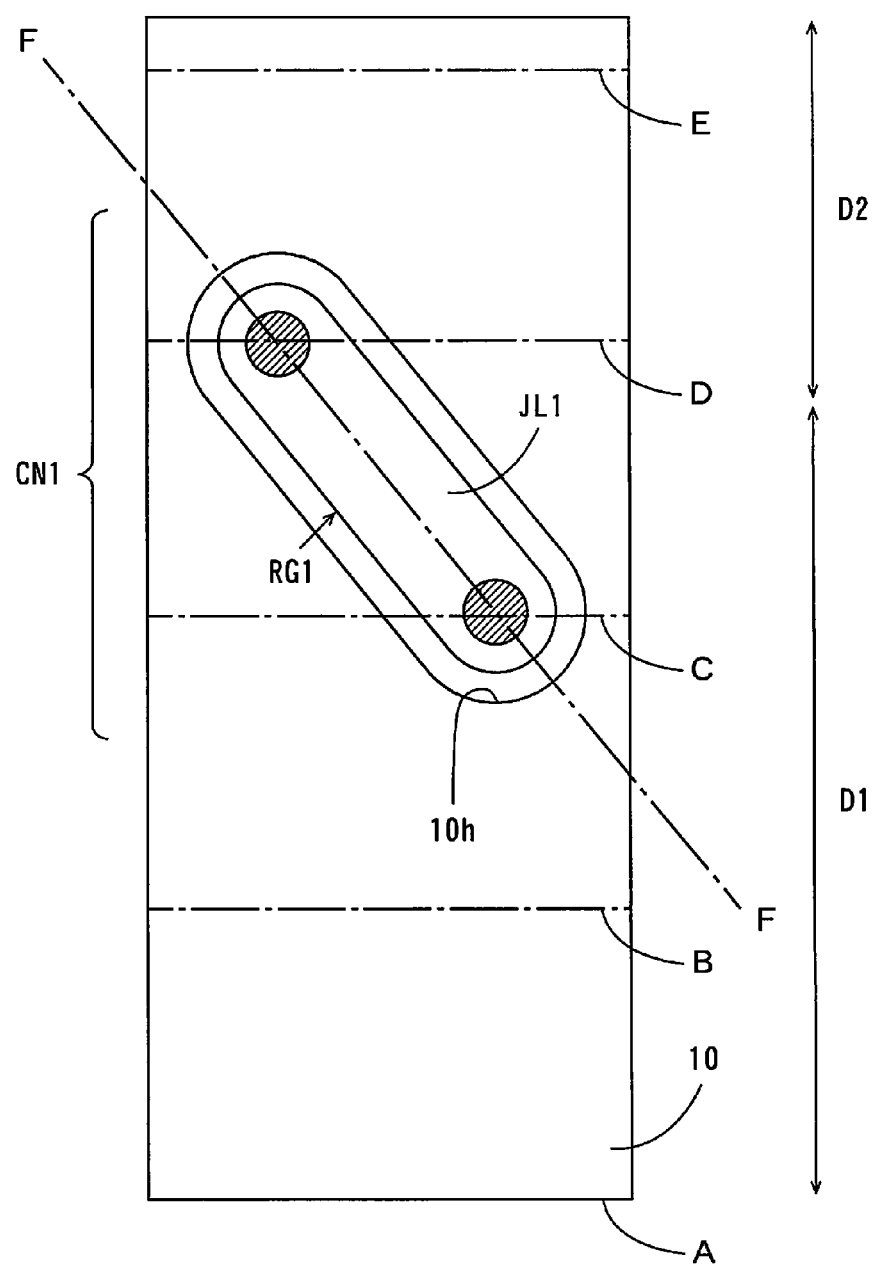
FIG. 6 is an enlarged plan view of a support substrate in the portion X of the suspension board illustrated in FIG. 2.

FIG. 4 is an enlarged plan view of portions of the write wiring traces W1 and W2 on the upper surface of the cover insulating layer 42a in the portion X of the suspension board 1 illustrated in FIG. 2. FIG. 5 is an enlarged plan view of portions of the write wiring traces W1 and W2 on the upper surface of the base insulating layer 41 in the portion X of the suspension board 1 illustrated in FIG. 2. FIG. 6 is an enlarged plan view of the support substrate 10 in the portion X of the suspension board 1 illustrated in FIG. 2.

As illustrated in FIG. 5, the line LA5 in the write wiring trace W1 is formed on the upper surface of the base insulating layer 41 in the interconnection region CN1. Similarly, the line LB5 (see FIG. 2) in the write wiring trace W2 is formed on the upper surface of the base insulating layer 41 in the interconnection region CN2 (see FIG. 2).

As illustrated in FIG. 4, the line LA1 in the write wiring trace W1 and the line LB1 in the write wiring trace W2 are formed on the upper surface of the cover insulating layer 42a in the first region D1. The line LA2 in the write wiring trace W1 and the line LB2 in the write wiring trace W2 are formed on the upper surface of the cover insulating layer 42a in the second region D2. Similarly, the lines LA4 and LB4 (see FIG. 2) in the write wiring traces W1 and W2 are formed on the upper surface of the cover insulating layer 42a in the third region D3 (see FIG. 2).

As illustrated in FIG. 6, an oval opening 10h is formed in the support substrate 10 in the interconnection region CN1. An overall insular region RG1, which is electrically separated from another region of the support substrate 10, is formed in the opening 10h. In this example, the insular region RG1 in the support substrate 10 formed on a lower surface of the base insulating layer 41 is a jumper wiring JL1. Similarly, an oval opening is formed in the support substrate 10 in the interconnection region CN2 (see FIG. 2). An oval insular region, which is electrically separated from another region of the support substrate 10, is formed in the opening. In this example, the insular region in the support substrate 10 formed on the lower surface of the base insulating layer 41 is a jumper wiring JL2 (see FIG. 2).

The shape of the opening 10h is not limited to an oval shape, and may have another shape such as a circular shape, a rectangular shape, or a polygonal shape. Similarly, the shape of the jumper wirings JL1 and JL2 is not limited to an oval shape, and may have another shape such as a circular shape, a rectangular shape, or a polygonal shape.

Figure 7A:
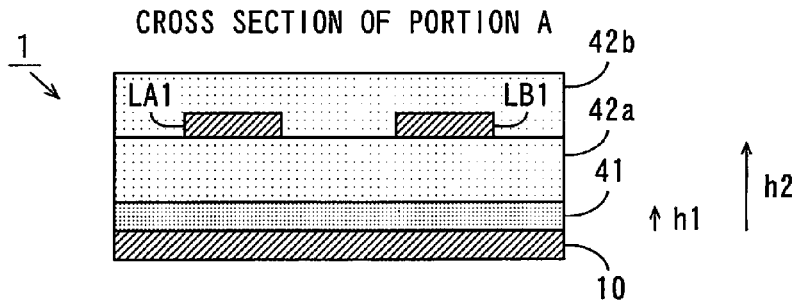
FIGS. 7 (*a*) to 7 (*c*) are vertical sectional views of the suspension board illustrated in FIGS. 3 to 6.
Figure 7B:
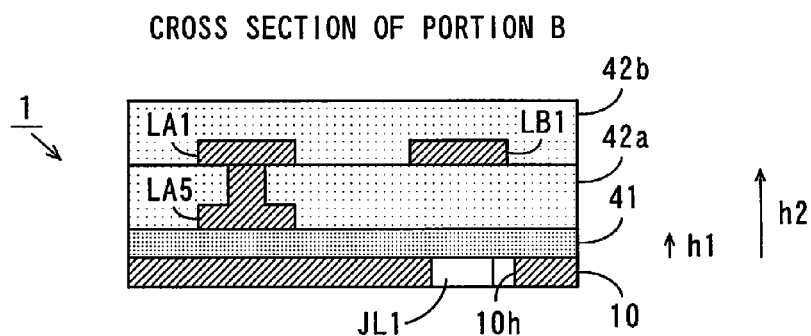
Figure 7C:
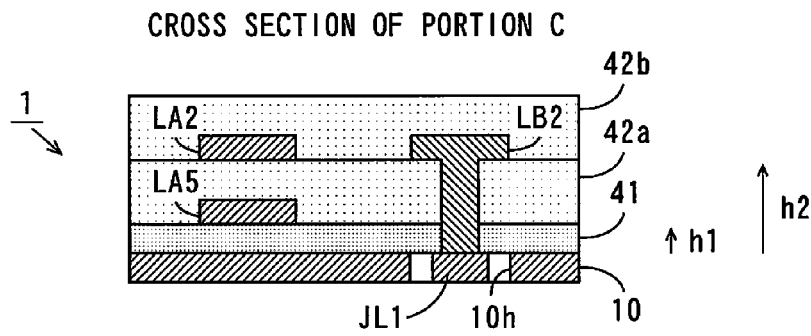
Figure 8A:
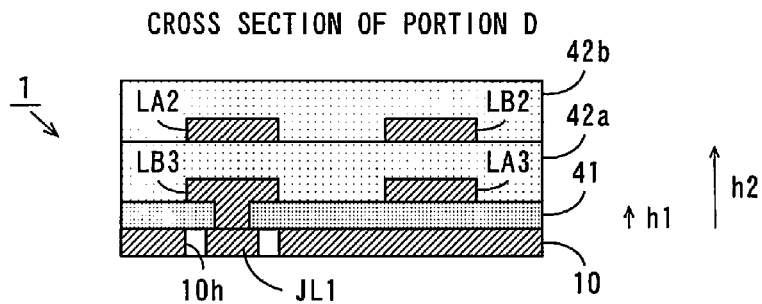
FIGS. 8 (*a*) to 8 (*c*) are vertical sectional views of the suspension board illustrated in FIGS. 3 to 6.
Figure 8B:
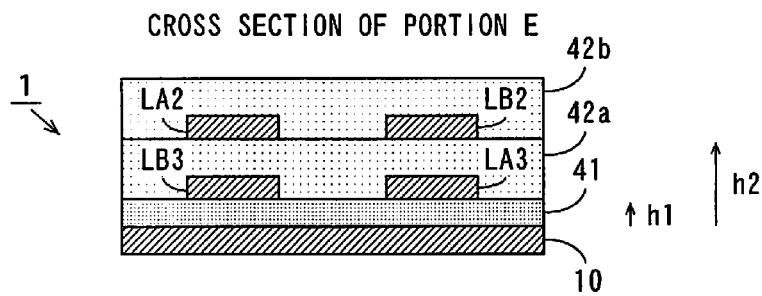
Figure 8C:
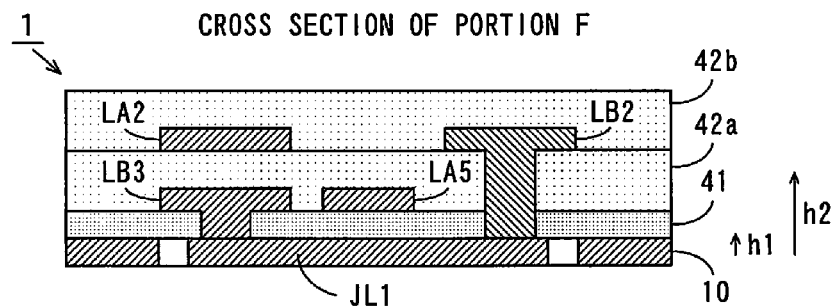
Figure 9A:
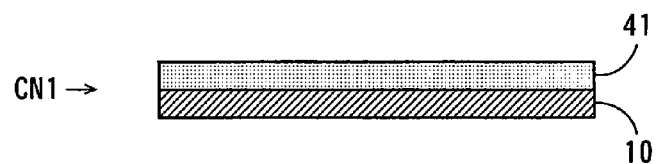
FIGS. 9 (*a*) and 9 (*b*) are vertical sectional views illustrating steps of manufacturing the suspension board.
Figure 9A:
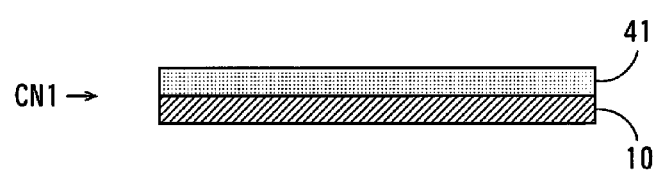
Figure 9B:
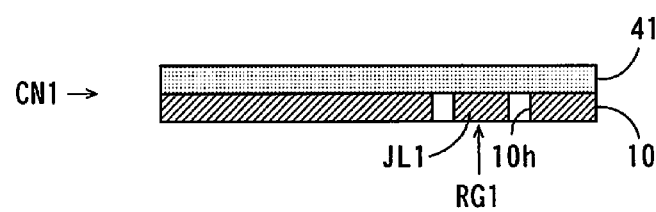
Figure 9B:
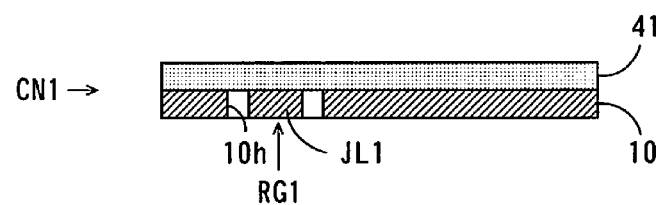
Figure 10A:
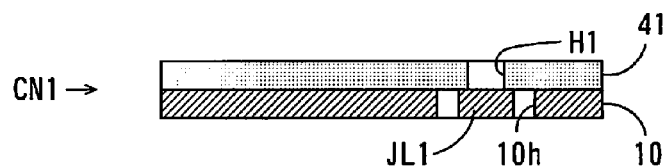
FIGS. 10 (*a*) and 10 (*b*) are vertical sectional views illustrating steps of manufacturing the suspension board.
Figure 10A:
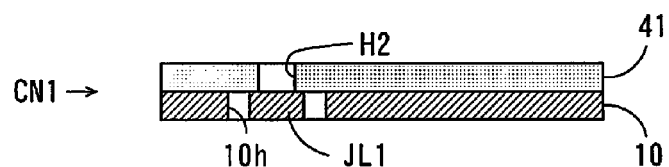
Figure 10B:
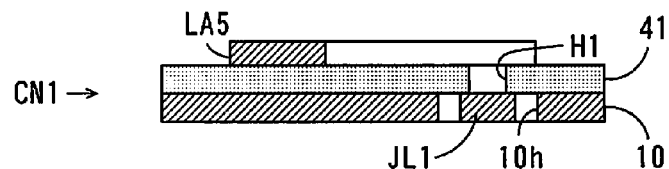
Figure 10B:
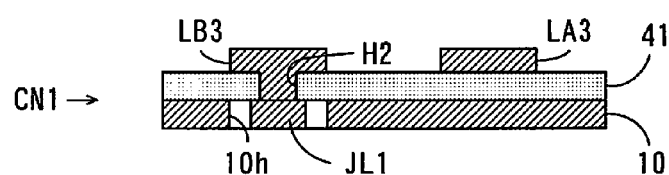
Figure 11A:
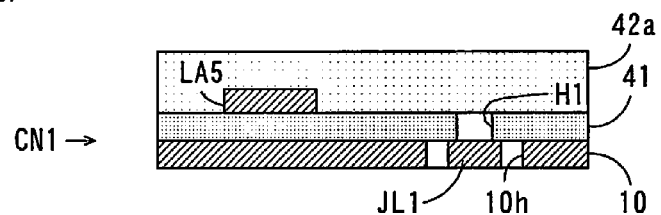
FIGS. 11 (*a*) and 11 (*b*) are vertical sectional views illustrating steps of manufacturing the suspension board.
Figure 11A:
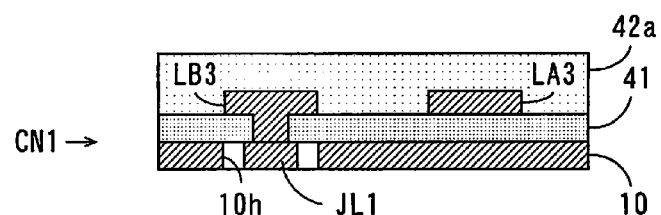
Figure 11B:
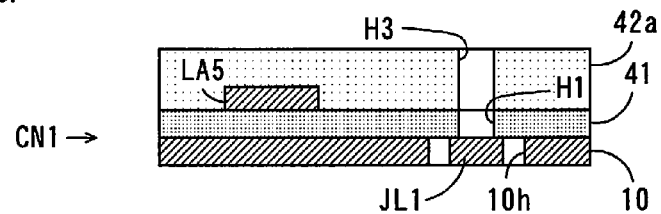
Figure 11B:
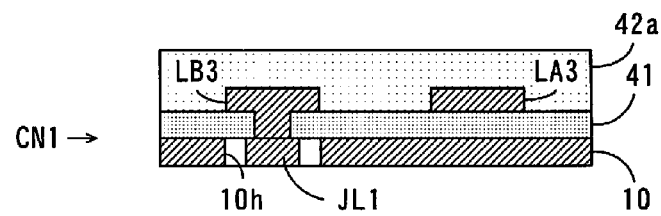
Figure 12A:
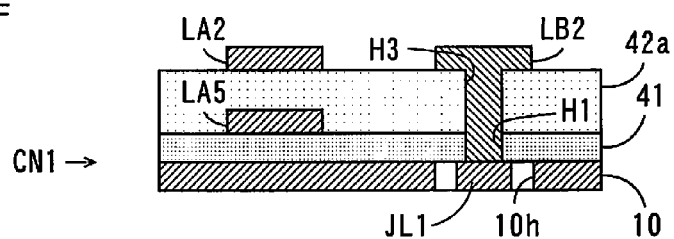
FIGS. 12 (*a*) and 12 (*b*) are vertical sectional views illustrating steps of manufacturing the suspension board.
Figure 12A:
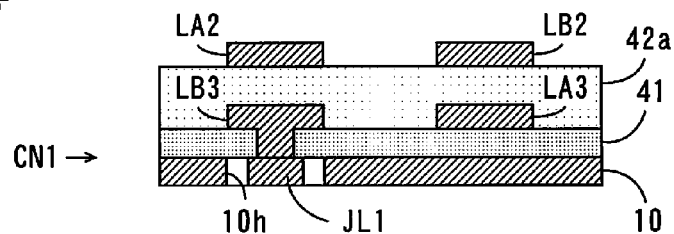
Figure 12B:
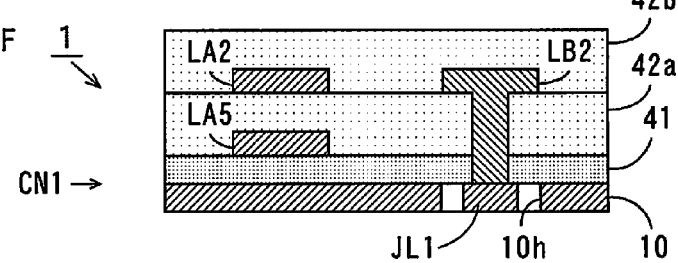
Figure 12B:
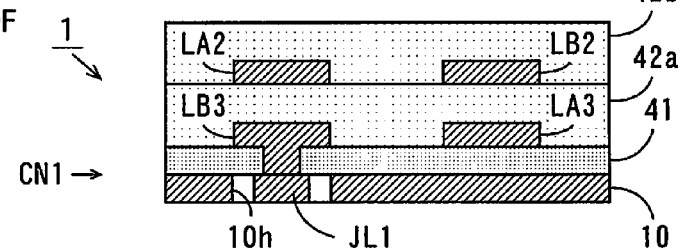

FIGS. 7 and 8 are vertical sectional views of the suspension board 1 illustrated in FIGS. 3 to 6. FIGS. 7 (a), 7 (b), and 7 (c) respectively illustrate a cross section of a portion A, a cross section of a portion B, and a cross section of a portion C of the suspension board 1 illustrated in FIGS. 3 to 6. FIGS. 8 (a) and 8 (b) respectively illustrate a cross section of a portion D and a cross section of a portion E of the suspension board 1 illustrated in FIGS. 3 to 6. FIG. 8 (c) illustrates a cross section of a portion F of the suspension board 1 illustrated in FIGS. 4 to 6.

As illustrated in FIGS. 7 (c) and 8 (c), a through hole is formed in portions of the base insulating layer 41 and the cover insulating layer 42a between the line LB2 and one end of the jumper wiring JL1, and the line LB2 and one end of the jumper wiring JL1 are electrically connected to each other through a conductive material within the through hole. As illustrated in FIGS. 8 (a) and 8 (c), a through hole is formed in portions of the base insulating layer 41 and the cover insulating layer 42a between the line LB3 and the other end of the jumper wiring JL1, and the line LB3 and the other end of the jumper wiring JL1 are electrically connected to each other through a conductive material within the through hole. Thus, the line LB2 and the line LB3 are electrically connected to each other through the jumper wiring JL1 in the interconnection region CN1.

Similarly, a through hole is formed in portions of the base insulating layer 41 and the cover insulating layer 42a between the line LA2 and one end of the jumper wiring JL2 (FIG. 2), and the line LA2 and one end of the jumper wiring JL2 are electrically connected to each other through a conductive material within the through hole. A through hole is formed in portions of the base insulating layer 41 and the cover insulating layer 42a between the line LA3 and the other end of the jumper wiring JL2, and the line LA3 and the other end of the jumper wiring JL2 are electrically connected to each other through a conductive material within the through hole. Thus, the line LA2 and the line LA3 are electrically connected to each other through the jumper wiring JL2 in the interconnection region CN2.

The lines LA1 and LB1 are arranged parallel to each other in the first region D1 (see FIG. 2) of the suspension board 1. As illustrated in FIGS. 7 (a) and 7 (b), the lines LA1 and LB1 are positioned at the second height h2 from the support substrate 10. As illustrated in FIGS. 7 (b) and 7 (c), the line LA5 is arranged at the height h1 from the support substrate 10. As illustrated in FIG. 7 (b), a through hole is formed in a portion of the cover insulating layer 42a between the line LA1 and the line LA5, and the line LA1 and the line LA5 are electrically connected to each other through a conductive material within the through hole. Similarly, the line LB5 illustrated in FIG. 2 is arranged at the first height h1 from the support substrate 10. A through hole is formed in a portion of the cover insulating layer 42a between the line LB4 and the line LB5, and the line LB4 and the line LB5 are electrically connected to each other through a conductive material within the through hole.

The lines LA3 and LB3 are arranged parallel to each other in the second region D2 (see FIG. 2) in the suspension board 1, and the lines LA2 and LB2 are arranged parallel to each other in the second region D2 (see FIG. 2) in the suspension board 1. As illustrated in FIG. 7 (c) and FIGS. 8 (a), 8 (b), and 8 (c), the lines LA2 and LB2 are positioned at the height h2 from the support substrate 10, and the lines LA3 and LB3 are positioned at the first height h1 from the support substrate 10. A lower surface of the line LA2 and an upper surface of the line LB3 are opposed to each other, and a lower surface of the line LB2 and an upper surface of the line LA3 are opposed to each other. Similarly, the lines LA4 and LB4 illustrated in FIG. 2 are arranged parallel to each other in the region D3 (see FIG. 2) in the suspension board 1. The lines LA4 and LB4 are positioned at the second height h2 from the support substrate 10.

(3) Method of Manufacturing Suspension Board

A method of manufacturing the suspension board 1 will be described below. FIGS. 9 to 12 are vertical sectional views illustrating steps of manufacturing the suspension board 1. Each of FIGS. 9 (a) to 12 (b) illustrates a step of manufacturing the cross section of the portion C of the suspension board 1 illustrated in FIG. 2, and steps of manufacturing a cross section of the portion D of the suspension board 1 illustrated in FIG. 2, respectively, in an upper portion and a lower portion.

As illustrated in FIG. 9 (a), a base insulating layer 41 composed of polyimide, for example, is first laminated using adhesives on the support substrate 10 made of stainless, for example.

The thickness of the support substrate 10 is not less than 5 μm nor more than 50 μm, for example, and preferably not less than 10 μm nor more than 30 μm. As the support substrate 10, stainless may be replaced with another metal such as aluminum or an alloy.

The thickness of the base insulating layer 41 is not less than 1 μm nor more than 15 μm, for example, and preferably not less than 2 μm nor more than 12 μm. As the base insulating layer 41, polyimide may be replaced with another insulating material such as epoxy resin.

As illustrated in FIG. 9 (b), the opening 10h is then formed in the support substrate 10 by etching or the like in the interconnection region CN1. Thus, the insular region RG1, which is separated from another region, is formed in the support substrate 10. The insular region RG1 in the support substrate 10 formed on the lower surface of the base insulating layer 41 is the jumper wiring JL1. The area of the insular region RG1 is not less than 2000 $\mu m^2$ nor more than 180000 $\mu m^2$, for example, and preferably not less than 3000 $\mu m^2$ nor more than 80000 $\mu m^2$.

As illustrated in FIG. 10 (a), through holes H1 and H2 are then formed by etching using a laser or wet etching, for example, in a portion of the base insulating layer 41 on the jumper wiring JL1 in the interconnection region CN1. The diameter of the through holes H1 and H2 is not less than 10 μm nor more than 200 μm, for example, and preferably not less than 20 μm nor more than 100 μm.

As illustrated in FIG. 10 (b), the lines LA3, LA5, LB3, and LB5 composed of copper, for example, are formed on the upper surface of the base insulating layer 41. The line LB5 is not illustrated in FIG. 10 (b). The through hole H2 is filled with a conductive material composed of copper, for example. Thus, the line LB3 is electrically connected to the jumper wiring JL1 through the conductive material in the through hole H2.

As illustrated in FIG. 11 (a), the cover insulating layer 42a composed of polyimide, for example, is formed on the upper surface of the base insulating layer 41 to cover the lines LA3, LA5, LB3, and LB5. The line LB5 is not illustrated in FIG. 11 (a). The thickness of the cover insulating layer 42a is not less than 4 μm nor more than 30 μm, for example, and preferably not less than 5 μm nor more than 25 μm. As the cover insulating layer 42a, polyimide resin may be replaced with another insulating material such as epoxy resin.

As illustrated in FIG. 11 (b), a through hole H3 communicating with the through hole H1 is formed by etching using a laser or wet etching, for example, is formed in a portion of the cover insulating layer 42a in the interconnection region CN1. The diameter of the through hole H3 is not less than 20 μm nor more than 200 μm, for example, and preferably not less than 40 μm nor more than 100 μm. The through hole H1 need not be formed in the base insulating layer 41 in the step illustrated in FIG. 10 (b), and the through holes H1 and H3 may be simultaneously formed in the step illustrated in FIG. 11 (b).

As illustrated in FIG. 12 (a), the lines LA1, LA2, LA4, LB1, LB2, and LB4 composed of copper, for example, are formed on the upper surface of the cover insulating layer 42a. The lines LA1, LA4, LB1, and LB4 are not illustrated in FIG. 12 (a). The through holes H3 and H1 are filled with a conductive material composed of copper, for example. Thus, the line LB2 is electrically connected to the jumper wiring JL1 through the conductive material in the through holes H3 and H1. As a result, the lines LB2 and LB3 are electrically connected to each other through the jumper wiring JL1.

As illustrated in FIG. 12 (b), the cover insulating layer 42b composed of polyimide, for example, is finally formed on the upper surface of the cover insulating layer 42a to cover the lines LA1, LA2, LA4, LB1, LB2, and LB4. The lines LA1, LA4, LB1, and LB4 are not illustrated in FIG. 12 (b). The thickness of the cover insulating layer 42b is not less than 2 μm nor more than 26 μm, for example, and preferably not less than 4 μm nor more than 21 μm. As the cover insulating layer 42a, polyimide resin may be replaced with another insulating material such as epoxy resin. Thus, the suspension board 1 is completed.

The lines LA1 to LA5 constitute the write wiring trace W1, and the lines LB1 to LB5 constitute the write wiring trace W2. The write wiring traces W1 and W2 may be formed using a semi-additive method, for example, or may be formed using another method such as a subtractive method.

The thickness of the write wiring traces W1 and W2 is not less than 3 μm nor more than 16 μm, for example, and preferably not less than 6 μm nor more than 13 μm. The respective widths of the lines LA1 to LA5 in the write wiring trace W1 and the lines LB1 to LB5 in the write wiring trace W2 are preferably not less than 10 μm nor more than 200 μm.

The write wiring traces W1 and W2 are not limited to copper, and may include another metal such as gold (Au) or aluminum or an alloy such as a copper alloy or an aluminum alloy (4) Effects In the present embodiment, the lines LA1 and LA2 in the write wiring trace W1 and the lines LB1 and LB2 in the write wiring trace W2 are arranged on the upper surface of the cover insulating layer 42a. The line LA3 in the write wiring trace W1 and the line LB3 in the write wiring trace W2 are arranged on the upper surface of the base insulating layer 41. The lines LA2 and LA3 are electrically connected to the line LA1 so that the line LA1 branches into the lines LA2 and LA3. The lines LB2 and LB3 are electrically connected to the line LB1 so that the line LB1 branches into the lines LB2 and LB3.

The line LA2 in the write wiring trace W1 is opposed to the line LB3 in the write wiring trace W2 with the cover insulating layer 42a sandwiched therebetween. The line LB2 in the write wiring trace W2 is opposed to the line LA3 in the write wiring trace W1 with the cover insulating layer 42a sandwiched therebetween. Further, the line LA2 in the write wiring trace W1 and the line LB2 in the write wiring trace W2 are opposed to each other on the cover insulating layer 42a. The line LA3 in the write wiring trace W1 and the line LB3 in the write wiring trace W2 are opposed to each other on the base insulating layer 41.

Thus, the area in which the write wiring trace W1 and the write wiring trace W2 are opposed to each other increases so that the respective capacitances of the write wiring traces W1 and W2 increase. As a result, the respective characteristic impedances of the write wiring traces W1 and W2 are reduced.

The line LA2 in the write wiring trace W1 and the line LB3 in the write wiring trace W2 overlap each other with the cover insulating layer 42a sandwiched therebetween, and the line LA3 in the write wiring trace W1 and the line LB2 in the write wiring trace W2 overlap each other with the cover insulating layer 42a sandwiched therebetween. Thus, the occupied area of the lines LA2 and LA3 in the write wiring trace W1 and the lines LB2 and LB3 in the write wiring trace W2 decreases.

The line LB1 is electrically connected to the line LB3 through the jumper wiring JL1 on the lower surface of the base insulating layer 41. In this case, a branch portion from the line LA1 into the lines LA2 and LA3 in the write wiring trace W1 and a branch portion from the line LB1 into the lines LB2 and LB3 in the write wiring trace W2 can be respectively formed at different positions in a thickness direction of the base insulating layer 41. Thus, the occupied area of the branch portion of the write wiring trace W1 and the branch portion of the write wiring trace W2 can be prevented from increasing.

Further, one of the lines LA2 and LA3 need not greatly bypass the write wiring trace W2 in the branch portion of the write wiring trace W1, and one of the lines LB2 and LB3 need not greatly bypass the write wiring trace W1 in the branch portion of the write wiring trace W2. Therefore, the respective lengths of the lines LA2 and LA3 in the write wiring trace W1 can be easily made equal to each other, and the respective lengths of the lines LB2 and LB3 in the write wiring trace W2 can be easily made equal to each other. Thus, a skew (shift in timing) of a signal that is transmitted through the lines LA2 and LA3 in the write wiring trace W1 and a skew of a signal that is transmitted through the lines LB2 and LB3 in the write wiring trace W2 can be reduced.

The line LB1 in the write wiring trace W2 is electrically connected to the jumper wiring JL1 through the through hole H1 in the base insulating layer 41 and the through hole H3 in the cover insulating layer 42a. Further, the line LB3 in the write wiring trace W2 is electrically connected to the jumper wiring JL1 through the through hole H2 in the base insulating layer 41. Thus, the occupied area of the branch portion of the write wiring trace W2 can be decreased. As a result, the suspension board 1 can be miniaturized.

(5) Other Embodiments (5-1) While the printed circuit board is the suspension board 1 in the above-mentioned embodiment, the present invention is not limited to this. The printed circuit board may be another printed circuit board such as a flexible printed circuit board. In this case, the printed circuit board does not include the support substrate 10. Therefore, the jumper wirings JL1 and JL2 are formed as a part of the support substrate 10 but separately.

Figure 13A:
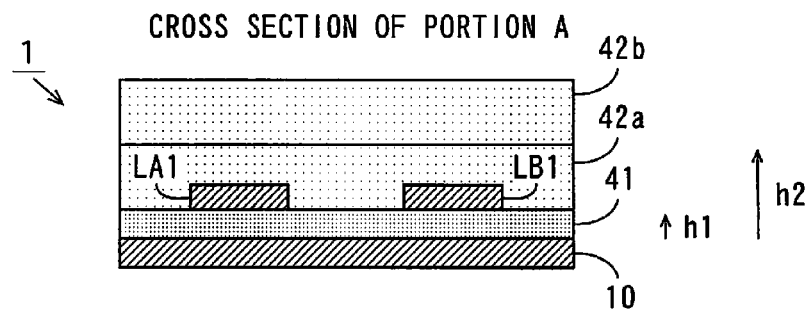
FIGS. 13 (*a*) and 13 (*c*) are vertical sectional views of a suspension board in a first modified example.
Figure 13B:
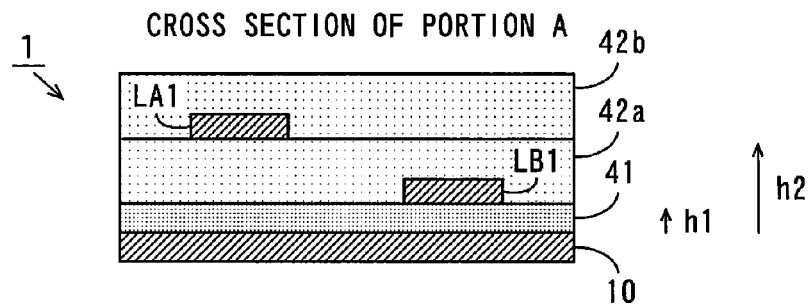
Figure 13C:
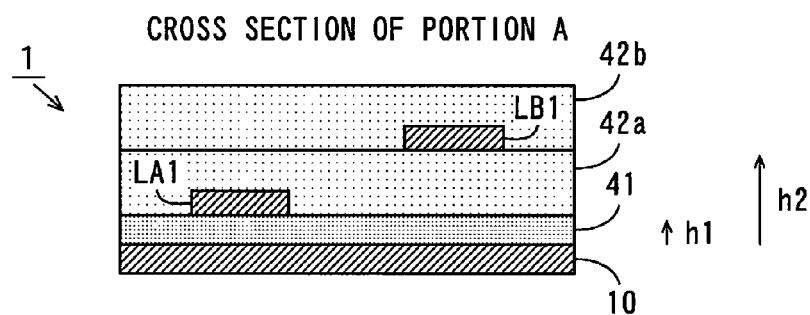

(5-2) While the lines LA1 and LB1 are positioned at the second height h2 from the support substrate 10 in the above-mentioned embodiment, the present invention is not limited to this. FIG. 13 is a vertical sectional view of a suspension board 1 in a first modified example. A cross section of the suspension board 1 illustrated in FIGS. 13 (a), 13 (b), and 13 (c) corresponds to the cross section of the portion A of the suspension board 1 illustrated in FIGS. 3 to 6. As illustrated in FIG. 13 (a), lines LA1 and LB1 may be positioned at a first height h1. As illustrated in FIG. 13 (b), the line LA1 may be positioned at a second height h2, and the line LB1 may be positioned at the first height h1. Further, as illustrated in FIG. 13 (c), the line LA1 may be positioned at the first height h1, and the line LB1 may be positioned at the second height h2.

Similarly, while lines LA4 and LB4 are positioned at the second height h2 from a base insulating layer 41, the present invention is not limited to this. The lines LA4 and LB4 may be positioned at the first height h1. The line LA4 may be positioned at the second height h2, and the line LB4 may be positioned at the first height h1. Further, the line LA4 may be positioned at the first height h1, and the line LB4 may be positioned at the second height h2.

Figure 14:
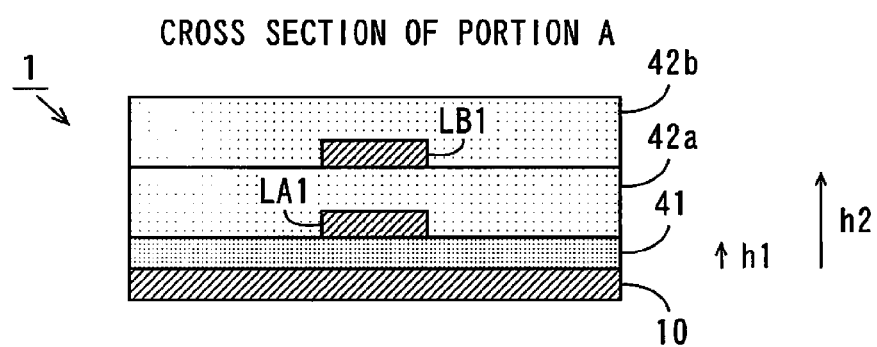
FIG. 14 is a vertical sectional view of a suspension board in a second modified example.

(5-3) While the lines LA1 and LB1 are spaced apart from and parallel to each other in the above-mentioned embodiment, the present invention is not limited to this. FIG. 14 is a vertical sectional view of a suspension board 1 in a second modified example. A cross section of the suspension board 1 illustrated in FIG. 14 corresponds to the cross section of the portion A of the suspension board 1 illustrated in FIGS. 3 to 6.

As illustrated in FIG. 14, lines LA1 and LB1 may be opposed to each other in a vertical direction (a stacked structure).

In the example illustrated in FIG. 14, the line LA1 and the line LB1 are respectively formed on an upper surface of a base insulating layer 41 and an upper surface of a cover insulating layer 42a so that an upper surface of the line LA1 and a lower surface of the line LB1 are opposed to each other. On the other hand, the line LB1 and the line LA1 may be respectively formed on the upper surface of the base insulating layer 41 and the upper surface of the cover insulating layer 42a so that an upper surface of the line LB1 and a lower surface of the line LA1 are opposed to each other.

Similarly, while lines LA4 and LB4 are spaced apart from and parallel to each other, the present invention is not limited to this. The lines LA4 and LB4 may be opposed to each other in a vertical direction (a stacked structure). For example, the line LA4 and the line LB4 may be respectively formed on the upper surface of the base insulating layer 41 and the upper surface of the cover insulating layer 42a so that an upper surface of the line LA4 and a lower surface of the line LB4 are opposed to each other. On the other hand, the line LB4 and the line LA4 may be respectively formed on the upper surface of the base insulating layer 41 and the upper surface of the cover insulating layer 42a so that an upper surface of the line LB4 and a lower surface of the line LA4 are opposed to each other.

(5-4) While the lines LA2 and LA3 are connected to the line LA4 in the interconnection region CN2 in the suspension board 1 in the above-mentioned embodiment, the present invention is not limited to this. If the line LA2 and the line LA3 are connected to each other in a magnetic head in the suspension board 1, the lines LA2 and LA3 need not be connected to the line LA4 in the interconnection region CN2 in the suspension board 1.

Similarly, while the lines LB2 and LB3 are connected to the line LB4 in the interconnection region CN2 in the suspension board 1, the present invention is not limited to this. If the line LB2 and the line LB3 are connected to each other in the magnetic head in the suspension board 1, the lines LB2 and LB3 need not be connected to the line LB4 in the interconnection region CN2 in the suspension board 1.

(5-5) While each of the read wiring traces R1 and R2 is formed of one line in the above-mentioned embodiment, the present invention is not limited to this. Each of the read wiring traces R1 and R2 may be formed of a plurality of lines configured so that an electric signal branches when transmitted, similarly to the write wiring traces W1 and W2.

(6) Correspondences Between Elements in the Claims and Parts in Embodiments

In the following paragraphs, non-limiting examples of correspondences between various elements recited in the claims below and those described above with respect to various preferred embodiments of the present invention are explained.

In the embodiments, described above, the suspension board 1 is an example of a printed circuit board, the base insulating layer 41 is an example of a first insulating layer, and the cover insulating layer 42a is an example of a second insulating layer. The upper surface and the lower surface of the base insulating layer 41 are respectively examples of first and second surfaces, and the upper surface and the lower surface of the cover insulating layer 42a are respectively examples of third and fourth surfaces. The write wiring traces W1 and W2 are respectively examples of first and second wiring traces, and the jumper wiring JL1 is an example of an insulating layer. The lines LA1 to LA3 are respectively examples of first to third lines, the lines LB1 to LB3 are respectively examples of fourth to sixth lines, and the through holes H1 and H2 are examples of first and second through holes.

As each of various elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

I claim:

1. A printed circuit board comprising:
a first insulating layer having first and second surfaces;
a second insulating layer having third and fourth surfaces and formed on said first insulating layer so that said fourth surface contacts said first surface;
first and second wiring traces formed on said first surface of said first insulating layer and said third surface of said second insulating layer, to constitute a signal line pair; and
a conductive connection layer formed on said second surface of said first insulating layer,
wherein said first wiring trace includes
a first line arranged on said first surface of said first insulating layer or said third surface of said second insulating layer,
a second line arranged on said third surface of said second insulating layer and electrically connected to said first line, and
a third line arranged on said first surface of said first insulating layer and electrically connected to said first line,
said second wiring trace includes
a fourth line arranged on said first surface of said first insulating layer or said third surface of said second insulating layer,
a fifth line arranged on said third surface of said second insulating layer and electrically connected to said fourth line, and
a sixth line arranged on said first surface of said first insulating layer and electrically connected to said fourth line,
at least a part of said second line is opposed to said sixth line with said second insulating layer sandwiched therebetween,
at least a part of said fifth line is opposed to said third line with said second insulating layer sandwiched therebetween, and
said fourth line is electrically connected to at least one of said fifth and sixth lines through said connection layer.

2. The printed circuit board according to claim 1, wherein said first insulating layer has a first through hole between said fourth line and said connection layer, and has a second through hole between at least one of said fifth and sixth lines and said connection layer, said fourth line is electrically connected to said connection layer through said first through hole, and at least one of said fifth and sixth lines is electrically connected to said connection layer through said second through hole.

3. The printed circuit board according to claim 1, wherein said first line and said fourth line are formed on said third surface of said second insulating layer.

4. The printed circuit board according to claim 1, wherein said first line and said fourth line are formed on said first surface of said first insulating layer.

5. The printed circuit board according to claim 1, wherein one of said first line and said fourth line is formed on said first surface of said first insulating layer, and the other one of said first line and said fourth line is formed on said third surface of said second insulating layer.

6. A method of manufacturing a printed circuit board, comprising the steps of:
- forming on a first insulating layer having first and second surfaces a second insulating layer having third and fourth surfaces so that said fourth surface contacts said first surface;
- forming first and second wiring traces constituting a signal line pair on said first surface of said first insulating layer and said third surface of said second insulating layer; and
- forming a conductive connection layer on said second surface of said first insulating layer,
- wherein the step of forming said first wiring trace includes the steps of
- forming a second line on said third surface of said second insulating layer,
- forming a third line on said first surface of said first insulating layer, and
- forming a first line on said first surface of said first insulating layer or said third surface of said second insulating layer,
- said second and third lines are electrically connected to said first line,
- the step of forming said second wiring trace includes the steps of
- forming a fifth line on said third surface of said second insulating layer,
- forming a sixth line on said first surface of said first insulating layer, and
- forming a fourth line on said first surface of said first insulating layer or said third surface of said second insulating layer,
- said fifth and sixth lines are electrically connected to said fourth line,
- at least a part of said second line is opposed to said sixth line with said second insulating layer sandwiched therebetween,
- at least a part of said fifth line is opposed to said third line with said second insulating layer sandwiched therebetween, and
- said fourth line is electrically connected to at least one of said fifth and sixth lines through said connection layer.

* * * * *